(12) United States Patent
Staals et al.

(10) Patent No.: US 11,733,615 B2
(45) Date of Patent: Aug. 22, 2023

(54) METHODS AND PATTERNING DEVICES AND APPARATUSES FOR MEASURING FOCUS PERFORMANCE OF A LITHOGRAPHIC APPARATUS, DEVICE MANUFACTURING METHOD

(71) Applicant: ASML Netherlands B.V., Veldhoven (NL)

(72) Inventors: Frank Staals, Eindhoven (NL); Christoph Rene Konrad Cebulla Hennerkes, Felton, CA (US)

(73) Assignee: ASML Netherlands B.V., Veldhoven (NL)

( * ) Notice: Subject to any disclaimer, the term of this patent is extended or adjusted under 35 U.S.C. 154(b) by 10 days.

(21) Appl. No.: 17/420,388

(22) PCT Filed: Dec. 5, 2019

(86) PCT No.: PCT/EP2019/083865
§ 371 (c)(1),
(2) Date: Jul. 1, 2021

(87) PCT Pub. No.: WO2020/141040
PCT Pub. Date: Jul. 9, 2020

(65) Prior Publication Data
US 2022/0091517 A1    Mar. 24, 2022

Related U.S. Application Data

(60) Provisional application No. 62/787,973, filed on Jan. 3, 2019.

(51) Int. Cl.
*G03F 7/20* (2006.01)
*G03F 7/00* (2006.01)

(52) U.S. Cl.
CPC ................ *G03F 7/70641* (2013.01)

(58) Field of Classification Search
CPC ............. G03F 7/70641; G03F 7/70525
See application file for complete search history.

(56) References Cited

U.S. PATENT DOCUMENTS 7,846,624 B2 * 12/2010 Smith ............... G03B 27/68
  430/30
7,855,037 B2 * 12/2010 Kim .................. G03F 9/7026
  430/5

(Continued)

FOREIGN PATENT DOCUMENTS

EP   1 997 045 B1   6/2016
EP   3 422 102 A1   1/2019

(Continued)

OTHER PUBLICATIONS

International Search Report and Written Opinion of the International Searching Authority directed to related International Patent Application No. PCT/EP2019/083865, dated Mar. 3, 2020; 8 pages.

(Continued)

*Primary Examiner* — Hung V Nguyen
(74) *Attorney, Agent, or Firm* — Sterne, Kessler, Goldstein & Fox P.L.L.C.

(57) ABSTRACT

Disclosed is a method for selecting a structure for focus monitoring. The method comprises: simulating a Bossung response with focus of a focus dependent parameter, for one or more different structures; and selecting a structure for focus monitoring in a manufacturing process based on the results of said simulating step. The simulating step may be performed using a computational lithography simulation.

12 Claims, 4 Drawing Sheets

(56) References Cited

U.S. PATENT DOCUMENTS

| | | |
|---|---|---|
| 11,067,902 B2 * | 7/2021 | Warnaar .................. G03F 7/705 |
| 2006/0033921 A1 | 2/2006 | Den Boef et al. |
| 2006/0066855 A1 | 3/2006 | Boef et al. |
| 2010/0201963 A1 | 8/2010 | Cramer et al. |
| 2010/0328655 A1 | 12/2010 | Den Boef |
| 2011/0027704 A1 | 2/2011 | Cramer et al. |
| 2011/0043791 A1 | 2/2011 | Smilde et al. |
| 2011/0069292 A1 | 3/2011 | Den Boef |
| 2011/0102753 A1 | 5/2011 | Van De Kerkhof et al. |
| 2011/0249244 A1 | 10/2011 | Leewis et al. |
| 2012/0044470 A1 | 2/2012 | Smilde et al. |
| 2012/0123581 A1 | 5/2012 | Smilde et al. |
| 2013/0183611 A1 | 7/2013 | Finders |
| 2013/0258310 A1 | 10/2013 | Smilde et al. |
| 2013/0271740 A1 | 10/2013 | Quintanilha |
| 2015/0046118 A1 | 2/2015 | Pandev et al. |
| 2018/0284623 A1 | 10/2018 | Tel et al. |
| 2022/0035256 A1 * | 2/2022 | Zhang .................. G03F 7/7085 |

FOREIGN PATENT DOCUMENTS

| | | |
|---|---|---|
| EP | 3 657 256 A1 | 5/2020 |
| NL | 2020323 A1 | 2/2018 |
| NL | 2022031 A1 | 12/2018 |
| WO | WO 03/043075 A1 | 5/2003 |
| WO | WO 2009/078708 A1 | 6/2009 |
| WO | WO 2009/106279 A1 | 9/2009 |
| WO | WO 2013/178422 A1 | 12/2013 |
| WO | WO 2016/008711 A1 | 1/2016 |
| WO | WO 2016/198283 A1 | 12/2016 |
| WO | WO 2018/046265 A1 | 3/2018 |

OTHER PUBLICATIONS

International Preliminary Report and Patentability directed to related International Patent Application No. PCT/EP2019/083865, dated Jun. 16, 2021; 6 pages.

* cited by examiner

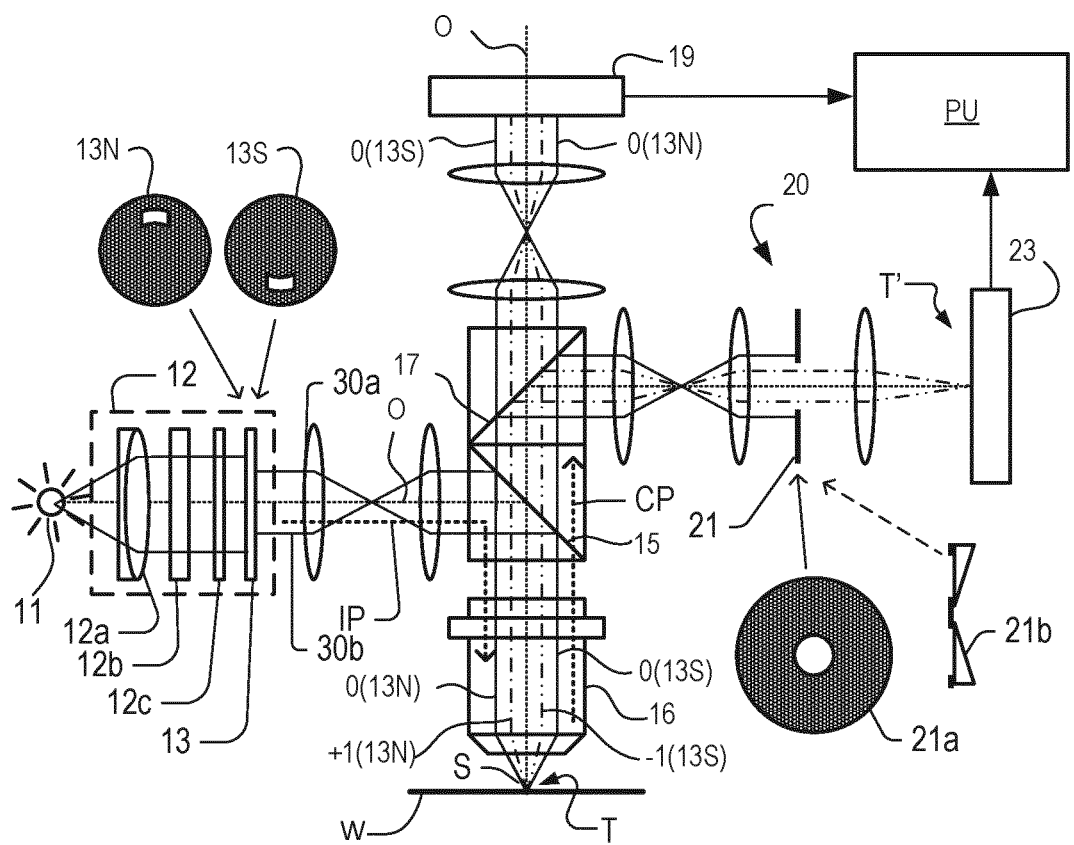
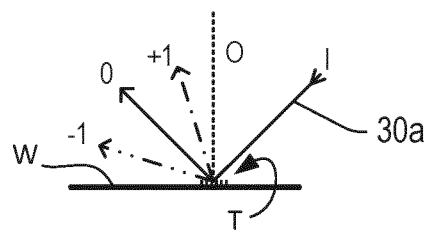
Fig. 3(a)
Fig. 3(b)

METHODS AND PATTERNING DEVICES AND APPARATUSES FOR MEASURING FOCUS PERFORMANCE OF A LITHOGRAPHIC APPARATUS, DEVICE MANUFACTURING METHOD

CROSS-REFERENCE TO RELATED APPLICATIONS

This application claims priority of U.S. application No. 62/787,973 which was filed on 3 Jan. 2019 and which is incorporated herein in its entirety by reference.

FIELD

The present invention relates to inspection apparatus and methods usable, for example, to perform metrology in the manufacture of devices by lithographic techniques. The invention further relates to such methods for monitoring a focus parameter in a lithographic process.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

Examples of known scatterometers include angle-resolved scatterometers of the type described in US2006033921A1 and US2010201963A1. The targets used by such scatterometers are relatively large, e.g., 40 µm by 40 µm, gratings and the measurement beam generates a spot that is smaller than the grating (i.e., the grating is underfilled). Diffraction-based overlay metrology using dark-field imaging of the diffraction orders enables measurement of overlay and other parameters on smaller targets. These targets can be smaller than the illumination spot and may be surrounded by product structures on a substrate. The intensities from the environment product structures can efficiently be separated from the intensities from the overlay target with the dark-field detection in the image-plane.

Examples of dark field imaging metrology can be found in international patent applications US20100328655A1 and US2011069292A1 which documents are hereby incorporated by reference in their entirety. Further developments of the technique have been described in published patent publications US20110027704A, US20110043791A, US2011102753A1, US20120044470A1, US20120123581A1, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

One important parameter of a lithographic process which requires monitoring is focus. There is a desire to integrate an ever-increasing number of electronic components in an IC. To realize this, it is necessary to decrease the size of the components and therefore to increase the resolution of the projection system, so that increasingly smaller details, or line widths, can be projected on a target portion of the substrate. As the critical dimension (CD) in lithography shrinks, consistency of focus, both across a substrate and between substrates, becomes increasingly important. CD is the dimension of a feature or features (such as the gate width of a transistor) for which variations will cause undesirable variation in physical properties of the feature.

Traditionally, optimal settings were determined by "send-ahead wafers" i.e. substrates that are exposed, developed and measured in advance of a production run. In the send-ahead wafers, test structures were exposed in a so-called focus-energy matrix (FEM) and the best focus and energy (exposure dose) settings were determined from examination of those test structures. More recently, focus metrology targets are included in the production designs, to allow continuous monitoring of focus performance. These metrology targets should permit rapid measurements of focus, to allow fast performance measurement in high-volume manufacturing. Ideally, the metrology targets should be small enough that they can be placed among the product features without undue loss of space.

Current test structure designs and focus measuring methods have a number of drawbacks. Known focus metrology targets require sub-resolution features and/or grating structures with large pitches. Such structures may contravene design rules of the users of lithographic apparatuses. Asymmetry in a grating structure can be measured effectively using high-speed inspection apparatus such as a scatterometer, working at visible radiation wavelengths. Known focus measuring techniques exploit the fact that focus-sensitive asymmetry can be introduced into structures printed in a resist layer by special design of the patterns on a patterning device that defines the target structure. For EUV lithography, where printing is performed using radiation of a wavelength less than 20 nm, for example 13.5 nm, the creation of sub-resolution features becomes even more difficult. For EUV lithography, resist thickness, and therefore the thickness of target structures, is smaller. This weakens the diffraction efficiency, and hence the signal strength, available for focus metrology.

For these reasons, there is a need to develop new techniques for the measurement of focus performance in lithographic processes, particularly in EUV lithography, but also for projection-based lithography in general.

SUMMARY

The present invention aims to provide alternative methods of measuring focus performance. In some aspects the invention aims to provide methods that are adaptable to new environments, such as EUV lithography. In some aspects, the invention aims to avoid the requirement for sub-resolution features to be defined in a patterning device.

The invention in a first aspect provides a method for selecting a structure for focus monitoring, the method comprising: simulating a Bossung response with focus of a focus dependent parameter, for one or more different structures; and selecting a structure for focus monitoring in a manufacturing process based on the results of said simulating step.

The invention in a second aspect provides a method of measuring focus performance of a lithographic apparatus, the method comprising: (a) obtaining measurement data relating to metrology of a structure selected by the method according to the first aspect, subsequent to said structure being formed on a substrate; and (b) deriving a measurement of focus performance based at least in part on the metrology data and a calibration model.

The invention yet further provides a metrology device operable to perform the second aspect.

The invention yet further provides a lithographic system comprising a lithographic apparatus comprising:
an illumination optical system arranged to illuminate a reflective patterning device;
a projection optical system arranged to project an image of the patterning device onto a substrate; and
a metrology apparatus according to the first aspect of the invention as set forth above,
wherein the lithographic apparatus is arranged to use the measurement of focus performance derived by the metrology apparatus when applying the pattern to further substrates.

The invention yet further provides computer program products for use in implementing methods and apparatuses according to various aspects of the invention as set forth above.

The invention yet further provides a method of manufacturing devices using the method according to the first aspect or the second aspect of the invention as set forth above.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 3(a) and 3(b) illustrate schematically an inspection apparatus adapted to perform angle-resolved scatterometry and dark-field imaging inspection methods;

DETAILED DESCRIPTION

Before describing embodiments of the invention in detail, it is instructive to present an example environment in which embodiments of the present invention may be implemented.

Figure 1:
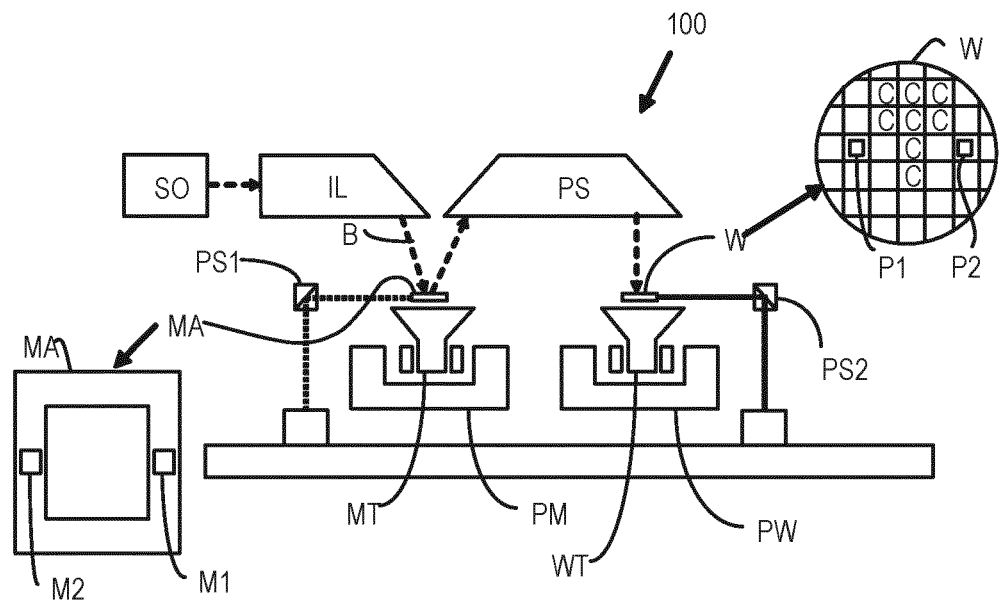
FIG. 1 depicts a lithographic apparatus having a reflective patterning device.

FIG. 1 schematically depicts a lithographic apparatus 100 including a source module SO according to one embodiment of the invention. The apparatus comprises:
an illumination system (illuminator) IL configured to condition a radiation beam B (e.g. EUV radiation).
a support structure (e.g. a mask table) MT constructed to support a patterning device (e.g. a mask or a reticle) MA and connected to a first positioner PM configured to accurately position the patterning device;
a substrate table (e.g. a wafer table) WT constructed to hold a substrate (e.g. a resist-coated wafer) W and connected to a second positioner PW configured to accurately position the substrate; and
a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

In general patterning devices used in lithography may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask). The focus metrology techniques of the present disclosure have been developed particularly for use with reflective patterning devices (reticles), where illumination is not in a direction normal to a plane of the patterning device surface, but at a slightly oblique angle. In principle, the same techniques could apply in relation to a transmissive patterning device, if for some reason illumination introduced asymmetry. Conventionally, illumination of the reticle is designed to be symmetrical, but with reflective reticles, that is not generally possible.

Certain embodiments of the present disclosure exploit asymmetry in the projection system using a reflective patterning device. Other embodiments are applicable with any kind of projection system.

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source module. The laser and the source module may be separate entities, for example when a CO2 laser is used to provide the laser beam for fuel excitation.

In such cases, the laser is not considered to form part of the lithographic apparatus and the radiation beam is passed from the laser to the source module with the aid of a beam delivery system comprising, for example, suitable directing mirrors and/or a beam expander. In other cases the source may be an integral part of the source module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

It will be understood that the lithographic apparatus is represented in FIG. 1 in a highly schematic form, but that is all that is necessary for the present disclosure.

Figure 2:
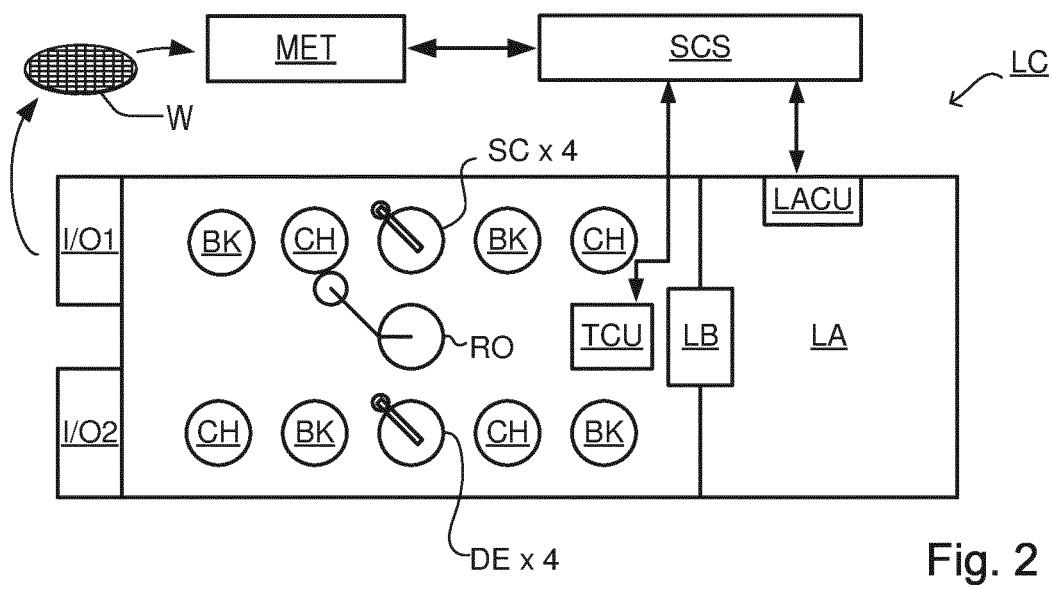
FIG. 2 depicts a lithographic cell or cluster in which a lithographic apparatus and metrology apparatus can be used to perform methods according to the present invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly, a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatuses have sufficient sensitivity to make useful measurements of the latent image. Therefore, measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

FIG. 3(a) shows schematically the key elements of an inspection apparatus implementing so-called dark field imaging metrology. The apparatus may be a stand-alone device or incorporated in either the lithographic apparatus LA, e.g., at the measurement station, or the lithographic cell LC. An optical axis, which has several branches throughout the apparatus, is represented by a dotted line 0. A target grating structure T and diffracted rays are illustrated in more detail in FIG. 3(b).

As described in the prior applications cited in the introduction, the dark-field imaging apparatus of FIG. 3(a) may be part of a multi-purpose angle-resolved scatterometer that may be used instead of or in addition to a spectroscopic scatterometer. In this type of inspection apparatus, radiation emitted by a radiation source 11 is conditioned by an illumination system 12. For example, illumination system 12 may include a collimating lens system, a color filter, a polarizer and an aperture device 13. The conditioned radiation follows an illumination path IP, in which it is reflected by partially reflecting surface 15 and focused into a spot S on substrate W via a microscope objective lens 16. A metrology target T may be formed on substrate W. Lens 16, has a high numerical aperture (NA), preferably at least 0.9 and more preferably at least 0.95 Immersion fluid can be used to obtain with numerical apertures over 1 if desired.

The objective lens 16 in this example serves also to collect radiation that has been scattered by the target. Schematically, a collection path CP is shown for this returning radiation. The multi-purpose scatterometer may have two or more measurement branches in the collection path. The illustrated example as a pupil imaging branch comprising pupil imaging optical system 18 and pupil image sensor 19. An imaging branch is also shown, which will be described in more detail below. Additionally, further optical systems and branches will be included in a practical apparatus, for example to collect reference radiation for intensity normalization, for coarse imaging of capture targets, for focusing and so forth. Details of these can be found in the prior publications mentioned above.

Where a metrology target T is provided on substrate W, this may be a 1-D grating, which is printed such that after development, the bars are formed of solid resist lines. The target may be a 2-D grating, which is printed such that after development, the grating is formed of solid resist pillars or vias in the resist. The bars, pillars or vias may alternatively be etched into the substrate. Each of these gratings is an example of a target structure whose properties may be investigated using the inspection apparatus.

The various components of illumination system 12 can be adjustable to implement different metrology 'recipes' within the same apparatus. In addition to selecting wavelength (color) and polarization as characteristics of the illuminating radiation, illumination system 12 can be adjusted to implement different illumination profiles. The plane of aperture device 13 is conjugate with a pupil plane of objective lens 16 and the plane of the pupil image detector 19. Therefore, an illumination profile defined by aperture device 13 defines the angular distribution of light incident on substrate W in spot S. To implement different illumination profiles, an aperture device 13 can be provided in the illumination path. The aperture device may comprise different apertures mounted on a movable slide or wheel. It may alternatively comprise a programmable spatial light modulator. As a further alternative, optical fibers may be disposed at different location in the illumination pupil plane and used selectively to deliver light or not deliver light at their respective locations. These variants are all discussed and exemplified in the documents cited above.

In a first example illumination mode, aperture 13N is used and rays 30a are provided so that the angle of incidence is as shown at 'I' in FIG. 3(b). The path of the zero order ray reflected by target T is labeled '0' (not to be confused with optical axis 'O'). In a second illumination mode, aperture 13S is used, so that rays 30b can be provided, in which case the angles of incidence and reflection will be swapped compared with the first mode. In FIG. 3(a), the zero order rays of the first and second example illumination modes are labeled 0(13N) and 0(13S) respectively. Both of these illumination modes will be recognized as off-axis illumination modes. Many different illumination modes, including on-axis illumination modes can be implemented for different purposes.

As shown in more detail in FIG. 3(b), target grating T as an example of a target structure is placed with substrate W normal to the optical axis O of objective lens 16. In the case of an off-axis illumination profile, a ray of illumination I impinging on grating T from an angle off the axis O gives rise to a zeroth order ray (solid line 0) and two first order rays (dot-chain line +1 and double dot-chain line −1). It should be remembered that with an overfilled small target grating, these rays are just one of many parallel rays covering the area of the substrate including metrology target grating T and other features. Since the beam of illuminating rays 30a has a finite width (necessary to admit a useful quantity of light), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown.

In the branch of the collection path for dark-field imaging, imaging optical system 20 forms an image T' of the target on the substrate W on sensor 23 (e.g. a CCD or CMOS sensor). An aperture stop 21 is provided in a plane in the imaging branch of the collection path CP which is conjugate to a pupil plane of objective lens 16. Aperture stop 20 may also be called a pupil stop. Aperture stop 21 can take different forms, just as the illumination aperture can take different forms. The aperture stop 21, in combination with the effective aperture of lens 16, determines what portion of the scattered radiation is used to produce the image on sensor 23. Typically, aperture stop 21 functions to block the zeroth order diffracted beam so that the image of the target formed on sensor 23 is formed only from the first order beam(s). In an example where both first order beams are combined to form an image, this would be the so-called dark field image, equivalent to dark-field microscopy. As an example of an aperture stop 21, aperture 21a can be used which allows passage of on-axis radiation only. Using off-axis illumination in combination with aperture 21a, only one of the first orders is imaged at a time.

The images captured by sensor 23 are output to image processor and controller PU, the function of which will depend on the particular type of measurements being performed. For the present purpose, measurements of asymmetry of the target structure are performed. Asymmetry measurements can be combined with knowledge of the target structures to obtain measurements of performance parameters of lithographic process used to form them. Performance parameters that can be measured in this way include for example overlay, focus and dose. Special designs of targets are provided to allow these measurements of different performance parameters to be made through the same basic asymmetry measurement method.

Referring again to FIG. 3(b) and the first example illumination mode with rays 30a, +1 order diffracted rays from the target grating will enter the objective lens 16 and contribute to the image recorded at sensor 23. When the second illumination mode is used, rays 30b are incident at an angle opposite to rays 30b, and so the −1 order diffracted rays enter the objective and contribute to the image. Aperture stop 21a blocks the zeroth order radiation when using off-axis illumination. As described in the prior publications, illumination modes can be defined with off-axis illumination in X and Y directions.

By comparing images of the target grating under these different illumination modes, asymmetry measurements can be obtained. Alternatively, asymmetry measurements could be obtained by keeping the same illumination mode, but rotating the target. While off-axis illumination is shown, on-axis illumination of the targets may instead be used and a modified, off-axis aperture 21 could be used to pass substantially only one first order of diffracted light to the sensor. In a further example, a pair of off-axis prisms 21b are used in combination with an on-axis illumination mode. These prisms have the effect of diverting the +1 and −1 orders to different locations on sensor 23 so that they can be detected and compared without the need for two sequential image capture steps. This technique, is disclosed in the above-mentioned published patent application US2011102753A1, the contents of which are hereby incorporated by reference. 2nd, 3rd and higher order beams (not shown in FIG. 3) can be used in measurements, instead of or in addition to the first order beams. As a further variation, the off-axis illumination mode can be kept constant, while the target itself is rotated 180 degrees beneath objective lens 16 to capture images using the opposite diffraction orders.

Figure 4:
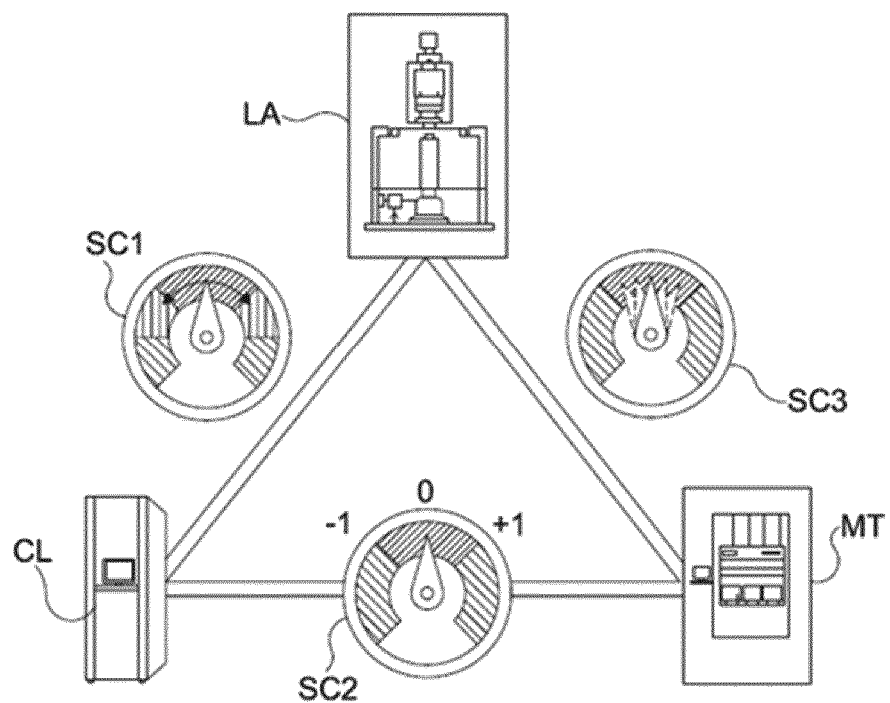
FIG. 4 depicts a schematic representation of holistic lithography, representing cooperation between three key technologies to optimize semiconductor manufacturing.

Typically the patterning process in a lithographic apparatus 100, LA is one of the most critical steps in the processing which requires high accuracy of dimensioning and placement of structures on the substrate W. To ensure this high accuracy, three systems may be combined in a so called "holistic" control environment as schematically depicted in FIG. 4. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 4 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 4 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 4 by the multiple arrows in the third scale SC3).

In the following disclosure, techniques will be illustrated for measuring focus performance of a lithographic process that uses oblique illumination on a reflective type of patterning device. These techniques may be applied in particular in EUV lithography, where reflective optics in a near-vacuum environment are required. Metrology targets including certain focus metrology patterns will be printed on the substrate, at the same time as product features are printed. Asymmetry in these printed patterns will be measured using for example diffraction based techniques in the apparatus of FIG. 3. To allow the use of small targets, it will be assumed that these asymmetry measurements will be performed using the dark-field imaging branch of the apparatus. Diffraction-based measurements of asymmetry can also be made using the pupil imaging branch, however. Of course, the apparatus shown in FIG. 3 is only one example of an inspection apparatus and method that may be used to measure asymmetry.

In the context of lithographic apparatuses working in the DUV wavelength range, targets for diffraction-based focus (DBF) measurements have been designed and used successfully. A known type of DBF target is produced by including sub-segmented features in a grating pattern on the reticle. These features have dimensions below the imaging resolution of the lithographic apparatus, alongside more solid features. Consequently, they do not print as individual features in the resist layer on the substrate, but they influence the printing of the solid features, in a manner that is sensitive to focus error. Specifically, the presence of these features creates an asymmetric resist profile for each line in the grating within the DBF metrology target, with the degree of asymmetry being dependent upon focus. Consequently a metrology tool such as the inspection apparatus of FIG. 3 can measure the degree of asymmetry from a target formed on the substrate, and translate this into the scanner focus.

Unfortunately, the known DBF metrology target designs are not suitable for use in all situations. In EUV lithography, resist film thicknesses are significantly lower than those used in DUV immersion lithography, leading to low diffraction efficiency and difficulty extracting accurate asymmetry information from diffracted radiation in the scatterometer. In addition, since the resolution of the imaging system is inherently higher in EUV lithography, features having dimensions below the printing resolution of DUV immersion lithography become "solid" features printable by EUV lithography. To provide analogous sub-resolution features on an EUV reticle is rather impractical, and/or may violate semiconductor manufacturer's "design rules". Such rules are generally established as a means to restrict the feature designs to ensure the printed features conform to their process requirements. In any case, working outside the design rules makes it difficult to simulate the performance of the process on the DBF targets, so that the optimum target design and the calibration of focus measurements becomes a matter of trial-and-error. The desire to conform to design rules applies to DBF targets in DUV lithography, not only EUV lithography.

The focus (DBF) metrology target should have a unique, and preferably monotonic, asymmetry signal as a function of target defocus. In this context, an asymmetry signal may describe a difference (e.g., an intensity and/or phase difference) in opposing higher diffraction orders (e.g., +1 and −1 diffraction orders). It is also important that precision and sensitivity is high. Other considerations include minimizing dose and other cross talk effects (e.g., resultant from processing effects), and the tool-to-tool matching between inspection tools should be good.

Figure 5:
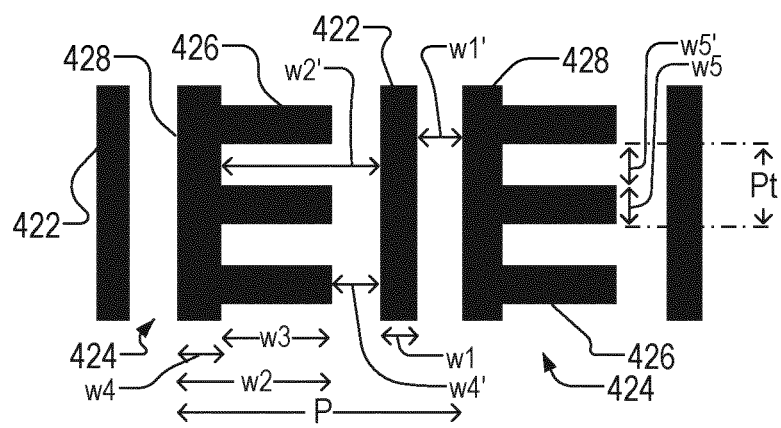
FIG. 5 shows a prior described example focus metrology pattern.

FIG. 5 illustrates a previous example for addressing the issues raised, as described in published European Patent Application EP3422102A1. Other focus target examples are described in (non-published) European Patent Application EP18207326.2, also published as Dutch patent application NL2022031A. Both of these documents are hereby incorporated by reference. The Figure shows in isolation a small portion of a focus metrology pattern. The repeating unit of this pattern comprises one first feature 422 and one second feature 424, spaced from each other in the direction of periodicity. The direction of periodicity in this example may be the X direction of the patterning device and substrate.

Each first feature 422 comprises a bar or other feature each having a minimum dimension w1 that is close to but not less than a resolution limit of the printing step. This value w1 may be for example less than 50 nanometers in the direction of periodicity. A second space, between each first feature 422 and its next nearest neighboring second feature 424, has a dimension w2' and is similar to the dimension w2 of the second features 424 themselves. Consequently, it will be seen that the pattern T comprising thin first features and thicker second features is effectively present in both positive and negative form. Putting these dimensions w1, w1' together with the much larger period P, it will be appreciated that the dimensions w2 and w2' are much greater than the minimum dimension w1 of the first features 422, and consequently much greater than the resolution limit of the printing step. Dimensions w2 and w2' may each be, for example, over four times, over five, six, eight or ten times the dimension w1. Each second feature in the periodic array further includes sub-features 426 having minimum dimensions close to but not less than a resolution limit of the printing step in a direction transverse to said direction of periodicity. The sub-features in this example are lines projecting asymmetrically from a main body 428 of the first feature. The length of these projecting lines or fingers is labelled w3. The main body 428 of each second features 424 defines a minimum dimension w4 of the second features in the direction of periodicity. Accordingly, in this notation, maximum dimension w2 of the second features 424 is equal to w3+w4. The minimum dimension of the sub-features in the transverse direction is labeled w5.

It is understood that it is only the gap between the sub-features 426 and the first features 422 changes through focus. And moreover, this variation is linear or at least monotonic, resulting in a monotonic asymmetry signal when the target is measured. It is therefore assumed that this gap depends on different Bossung behavior between that of a first edge defined by the ends of the sub features and a second edge defined by the first features 422. The first edge effectively pulls back (the length of sub-features 426 become smaller) with defocus while the position of the second edge remains relatively stable. An effective Bossung shift may also come from a physical height difference: the sub-features 426 being effectively sampled at a lower resist height than the first features 422.

It has been observed a good principle for a target is one based on a differential of two Bossung like signals with a focus shift between them. Most present techniques will yield a single Bossung, with no sign information and zero sensitivity around best focus. Such a concept, for example, was described in PCT patent application WO2016/198283A1, which is incorporated herein by reference.

As can be appreciated, there is a large design space attached to such focus targets. To begin, there is a large number of different design principles, of which the examples described in EP3422102A1 and EP18207326.2/NL2022031A are only examples. For each of these design principles, there is a large number of parameters which can be varied (e.g., pitches, duty cycles, any of the dimensions of any feature of the target, e.g., such as described and illustrated on the FIG. 5 example etc.). In addition, the relationship between focus performance (e.g., Bossung response) and variations within this design space is not completely understood.

It is therefore proposed to simulate the Bossung response of structures, e.g., by using computational lithography methods, to identify and/or optimize structure design in terms of Bossung response. More specifically, in an embodiment, one or more Bossung parameters relating to the Bossung response performance of different structures will be evaluated. Each structure may comprise, for example, two (or more) features, each with a corresponding Bossung signal or curve. One such Bossung parameter may comprise a Bossung differential parameter. A Bossung response comprising a suitable Bossung differential parameter may comprise a Bossung response having two such Bossung like signals separated by a (e.g., sufficiently large) focus shift. A Bossung differential parameter may be expressed in terms of the focus shift, or in terms of a target parameter (e.g., critical dimension CD) difference or delta CD). In the latter case, the delta CD can be considered with respect to the focus shift (e.g., a plot of delta CD against focus shift). Another relevant Bossung parameter may comprise a Bossung curvature parameter describing the curvature of one or both of the Bossung like signals.

Figure 6:
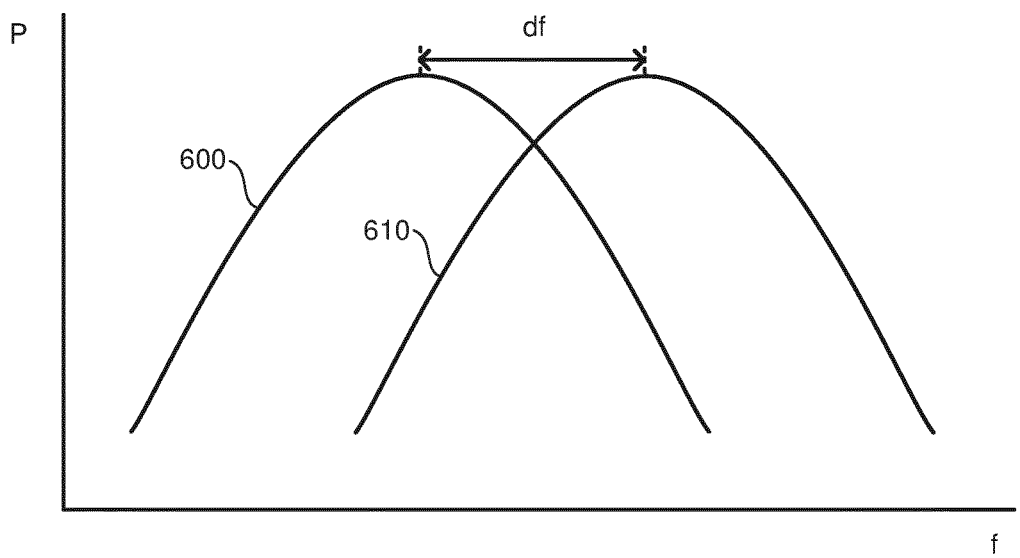
FIG. 6 is a plot of a focus dependent parameter against focus for a structure comprising a pair of features having a focus response displaying a Bossung differential.

FIG. 6 illustrates the principle. It comprises a plot of a target parameter P (such as CD) against focus f, illustrating a focus response of a particular target design. The focus response comprises a first Bossung signal 600 and second Bossung signal 610 separated by a Bossung differential df (e.g., focus shift between the first Bossung signal 600 and second Bossung signal 610). For example, the structure may comprise a first feature which is responsible for the first Bossung signal 600 and second feature which is responsible for the second Bossung signal 610. This Bossung differential df can be shown to vary monotonically with focus f. Preferably the magnitude of this Bossung differential should be maximized, or at least should be sufficiently large to yield a reliable signal (e.g., above a threshold differential). A further consideration is to optimize (e.g., maximize) the Bossung curvature of each (or at least one) of the first Bossung signal 600 and second Bossung signal 610. An additional embodiment may comprise co-optimizing the Bossung differential and Bossung curvature; e.g., to maximize a combination of both.

For example, the Bossung differential parameter (e.g., when describing a focus shift between the Bossung signals 600, 610) and the Bossung curvature parameter may be co-optimized, e.g., to minimize a noise metric. The noise metric may be, for example, a measure of the amount of noise (on the vertical axis) with respect to (e.g., divided by) the local slope of the curve, in a plot of the Bossung differential against focus. A similar result may be achieved (e.g., when the Bossung differential parameter is delta CD) by maximizing the slope of a plot of delta CD versus focus shift over a suitable wide focus shift range for which the delta CD shows a monotonic response.

In an embodiment, instead of a Bossung differential parameter, the Bossung parameter evaluated may comprise the Bossung sum (sum of the two curves). However, this loses the advantage that a differential parameter (at least partly) cancels non-focus contributors (partly) common to both Bossungs (e.g. dose impact).

It should be noted that FIG. 6 is a purely exemplary plot, and the actual plots may vary. For example, there may be a target parameter (e.g., CD) shift between the first Bossung signal 600 and second Bossung signal 610. Such a CD shift would have no impact on the proposed method. It is also possible that the first Bossung signal 600 and second Bossung signal 610 have different curvatures. This would result in a curvature residual in the delta curve, and potentially non-monotonicity. However, this would not be a problem for a multi-dimensional calibration curve, provided the curves have a sufficiently unique response (e.g., the curves do not cross themselves).

The structures for which Bossung response is simulated may comprise specifically designed focus targets and/or product structures forming part of the device. When product structures are being evaluated, the simulation may comprise identifying which product structures provide suitable and/or best focus response (e.g., comprise a pair of features with sufficient or optimal Bossung differential response). Alternatively, or in addition, the simulation may comprise optimizing any aspect of design of the product structures (and/or product-like structure), e.g., improving their focus response for focus metrology purposes. In the latter case, the simulation may further comprise evaluating whether the optimized design will still function correctly. Any kind of structures that are simulated/optimized by computational lithography (e.g., using a source-mask optimization (SMO) technique) can be used. Those could be anything from simple line/space patterns through contact holes/vias to more complex logic patterns. Therefore, in terms of simulation, there is no real limitation in the structures simulated, although there will naturally be measurement considerations as measurement of the selected structure(s) should be reliable and robust.

Computational lithography describes the use of computer modeling to predict, correct, optimize and verify imaging performance of the lithography process over a range of patterns, processes, and system conditions. In computational lithography simulation, the output of the simulation process will provide information on the predicted shapes and sizes of printed features on the wafer, such as predicted critical dimensions (CDs) and contours. Such predictions allow a quantitative evaluation of the lithographic printing process and on whether the process will produce the intended results. Accurate CD predictions highly depend on the accuracy of the models used in the lithography simulation. Such models may comprise image-based 3D mask models or thin-mask models for example.

Computational lithography techniques comprise, or are used in, for example, a full chip simulation or verification method such as LMC (Lithography Manufacturability Check). LMC applies a set of models (e.g., models used in optical proximity correction (OPC)) to predict CD (on the substrate) across a field. Its major purpose is highlight critical patterns in the field before a photomask order is sent to a mask shop. In addition it enables pull out of design regions that are sensitive to process condition variation. LMC basically comprises a comparison of the simulated full-chip resist contour against the design target.

Another computational lithography technique is source-mask optimization (SMO), which comprises modeling of illumination profiles to be used in the optimization of imaging performance. SMO enables optimization of lithography processes at the design, mask and imaging levels. Use cases include design rule validation and production illumination optimization. More specifically, SMO is typically used to simultaneously co-optimize mask design and source shape to find a combination that achieves the necessary k1 value with a process window large enough for robust manufacturing.

It is therefore proposed to simulate on-product imaging performance, and in particular the Bossung differential (or mutual Bossung shift) for candidate structures. Such a simulation will enable prediction of which structures (e.g., clips or targets) have the largest Bossung differential, or at least have a sufficient Bossung differential for focus monitoring. Alternatively or in addition, the simulation may also determine whether additional features (e.g., product-like features) can be added, or how the design of a structure (e.g., actual product structure) may be altered, to improve the Bossung response. Where the design of an actual product structure is altered, the simulation should also evaluate that the resultant structure will yield (e.g., still function). A sufficient Bossung differential may comprise more than 5 nm, more than 10 nm, more than 15 nm or more than 20 nm, for example. It should be noted that simulation accuracy of the exact Bossung shift is not required.

As computational lithography techniques, in at least some embodiments, are used to simulate the Bossung responses, then the simulation can also (e.g., simultaneously and/or as part of the same overall process) evaluate and/or simulate other aspects of the structure. For example, the simulation may evaluate and identify which structures are critical and/or lithography sensitive. This better enables selection of the most lithography critical and therefore the most sensitive structures for optimization. Other aspects which may be evaluated may include exposure/printing qualities such as the printability robustness (e.g., evaluate how accurately and how reproducibly a structure can be printed/exposed). As such, any proposed optimization of a structure may be a co-optimization between Bossung response and such exposure/printing qualities. Also, particularly where product structures are being used for the focus monitoring, the simulation may also evaluate whether the product structures will yield. Ultimately the simulation may determine simulated data for any performance parameter.

In an embodiment, machine learning techniques may be used to preselect structures that are likely to be sensitive, thereby reduce the evaluation space (e.g., the number of structures which require simulation). Possible criteria for training may include, for example, measurability and/or sensitivity. In particular, when computational lithography techniques are used as described, all the structures may be simulated/optimized in any case and therefore all the required data may already be present.

More specifically, in such a machine learning embodiment, a large set of structures (or structure variables) are input to a trained model. The trained model may output a preselection of structures and/or a suitability score for each structure. The suitability score may be, for example a measurability value and/or sensitivity value. Training of the model could be performed based on existing pattern sets used in computational lithography (e.g., SMO). As these will likely have already been simulated/optimized, at least the sensitivity values would already be known.

The structures being evaluated may comprise scribe lane structures (e.g., a dedicated focus target) and/or in-die structures. An in-die structure may comprise two features which yield a suitable Bossung response, and which are sufficiently close spatially. As such, a structure may comprise features from two distinct structures which are suitable proximate, and the term "structure" in the context of this disclosure refers to any pair (or more) of features which provide a suitable focus response and are sufficiently proximate for focus monitoring, regardless of whether they are comprised within the same functional structure in terms of the device's function. Sufficiently close or proximate may comprise, for example, being spaced apart by no more than 3 mm, or no more than 1 mm, or no more than 0.5 mm, or no more than 0.2 mm.

The result of the simulation may be a suitable structure comprising two features having a sufficient Bossung differential. This structure can then be exposed multiple times on a substrate with varied focus (and optionally dose). Such a substrate may be an FEM substrate. An FEM substrate is known in the art, and typically comprises a substrate that has been coated with a photoresist onto which a pattern is exposed with multiple combinations of focus and exposure offsets. The FEM substrate is measured by the metrology tool to determine a focus dependent parameter, such as one or both of sidewall angles (SWA) and critical dimensions (CD), using e.g., reconstruction methods. A focus model or focus-dose model can then be constructed from these measurements and the known focus values (e.g., as set). A focus-dose model describes and interpolates the relationship between focus and dose and CD and SWA. With this interpolated model, any single CD and/or SWA measurement can be converted to focus and dose. Such a method is described, for example, in US patent application US2011-0249244, incorporated herein by reference in its entirety.

A Bossung differential parameter can then be measured from the FEM substrate (using any suitable metrology method including scatterometry or SEM/e-beam) for each of the exposures. A Bossung differential parameter may comprise, for example, the difference between a measured focus dependent parameter for each of a first feature and second feature of the structure; and more specifically a CD differential between these two features. The measurements will yield a calibration curve for Bossung differential parameter. However, where the calibration curve relates to focus shift Bossung differential parameter, the Bossung curves should be similar (i.e., a monotonic calibration curve). For focus metrology during production, the Bossung differential parameter is measured on a product substrate, and the calibration curve is used to infer on-product focus performance. Inference algorithms may comprise any calibration model including a calibration curve fitting, multi-dimensional calibration curves, machine learning model or any other suitable model.

The calibration may be based on the Bossung differential parameter, or directly on two or more focus dependent parameter (e.g., CD) inputs. Alternatively, instead of CD, another parameter (which shows a suitable Bossung response) may be measured from each feature to determine the Bossung differential parameter. For example, the target may be designed such that the CD metrology is translated into an asymmetry or overlay measurement, such as is done on μDBF techniques.

In an embodiment, the structure may further comprise a third, dose sensitive (but focus insensitive) feature to further reduce dose dependency. The method may also comprise simulating the dose dependency of such a dose sensitive feature to optimize its dose response, or at least determine whether its dose response is sufficient. Other features, such as space features, (which have inverted Bossung signals) may be added to the structure to provide for a double differential metrology. The simulation may therefore also simulate the Bossung response of these space features when optimizing/evaluating the target.

Figure 7:
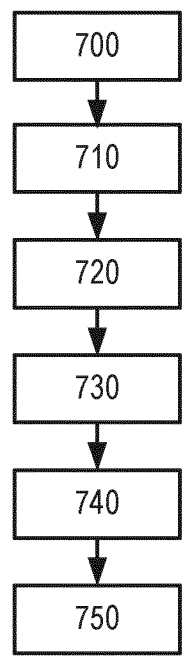
FIG. 7 is a flowchart of a method of monitoring focus according to an embodiment of the invention.

FIG. 7 is a flowchart describing a method according to an embodiment. At step 700, the Bossung response of numerous different structures is simulated using computational lithography. At step 710, the structures are evaluated according to their respective Bossung parameters. The structure considered optimal (or at least sufficient) in terms of at least a Bossung differential parameter is selected. This step may comprise a co-optimization of Bossung differential parameter and Bossung curvature parameter. At step 720, a calibration curve of focus against a Bossung differential parameter (e.g., CD differential or delta CD between features of the structure or focus shift) is determined; for example by exposing and measuring an FEM. At step 730, a product substrate comprising said one or more of structures is exposed. The structures may be formed, for example, in a scribe lane or in-die. At step 740, the Bossung differential parameter is measured using a suitable metrology method and at step 750, focus is determined from the Bossung differential parameter and calibration curve.

In conclusion, a method of manufacturing devices using the lithographic process can be improved by performing focus measurement methods as disclosed herein, using it to measure processed substrates to measure parameters of performance of the lithographic process, and adjusting parameters of the process (particularly focus) to improve or maintain performance of the lithographic process for the processing of subsequent substrates.

While the target structures including and focus metrology patterns described above are metrology targets specifically designed and formed for the purposes of measurement, in other embodiments, properties may be measured on targets which are functional parts of devices formed on the substrate. Many devices have regular, grating-like structures. The terms "metrology pattern" and "metrology target" and the like as used herein do not require that the structure has been provided specifically for the measurement being performed.

Further embodiments are disclosed in the subsequent clauses:

1. A method for selecting a structure for focus monitoring, the method comprising:
    simulating a Bossung response with focus of a focus dependent parameter, for one or more different structures; and
    selecting a structure for focus monitoring in a manufacturing process based on the results of said simulating step.
2. A method as defined in clause 1, wherein the simulating step is performed using a computational lithography simulation.
3. A method as defined in clause 1 or 2, wherein said one or more structures each comprise at least a first feature having a first Bossung curve response with focus for said focus dependent parameter and a second feature having a second Bossung curve response with focus for said focus dependent parameter; and wherein said simulating step comprises:
    simulating, for each of said one or more structures, values for one or more Bossung parameters describing a relative relationship between the first Bossung curve response and second Bossung curve response.
4. A method as defined in clause 3, wherein one or more Bossung parameters comprise at least a Bossung differential parameter based on a simulated relative focus shift between said first Bossung curve response with focus and said second Bossung curve response with focus.
5. A method as defined in clause 4, wherein said relative focus shift is determined as a focus difference between corresponding points of said first Bossung curve response with focus and said second Bossung curve response with focus.
6. A method as defined in clause 4 or 5, comprising:
    simulating a value for a Bossung differential parameter for each of a plurality of said structures; and
    selecting a structure for focus monitoring out of said plurality of structures based on the determined values for a Bossung differential parameter.
7. A method as defined in clause 6, wherein the structure selected is one for which the simulated value for said Bossung differential parameter exceeds a threshold value.
8. A method as defined in clause 7, wherein the Bossung differential parameter comprises a focus shift between Bossung responses of two of said structures.
9. A method as defined in clause 8 wherein the threshold value is 5 nm.
10. A method as defined in clause 8, wherein the threshold value is 10 nm.
11. A method as defined in any of clauses 6 to 10, wherein said one or more Bossung parameters further comprise a Bossung curvature parameter, said Bossung curvature parameter describing the degree of curvature of said first Bossung curve response and/or said second Bossung curve response, and said selecting step comprises selecting a structure also based on determined values for the Bossung curvature parameter.
12. A method as defined in any of clauses 6 to 11, wherein the structure selected is based on a co-optimization which tends to maximize both of the simulated value for the Bossung differential parameter and simulated value for the Bossung curvature parameter.
13. A method as defined in clause 7, wherein the Bossung differential parameter comprises a difference between the focus dependent parameter with respect to a focus parameter or focus differential parameter.
14. A method as defined in clause 13, wherein said threshold describes a threshold slope of said focus dependent parameter with respect to a focus parameter or focus differential parameter.
15. A method as defined in clause 14, wherein the structure selected is one for which the simulated value for the threshold slope is maximal over a monotonic region.
16. A method as defined in any of clauses 6 to 15, wherein:
    said simulating step comprises simulating one or more printing qualities, and
    said selecting step comprises selecting the structure based on a co-optimization of the Bossung differential parameter and said one or more printing qualities.
17. A method as defined in any of clauses 6 to 16, comprising applying a trained model to determine a preselected subset of said structures from which said selection will be made in said selecting step.
18. A method as defined in any of clauses 3 to 17, wherein said focus dependent parameter comprises a critical dimension of each of said first and second feature.
19. A method as defined in any of clauses 3 to 18, wherein said simulating step comprises optimizing one or more aspects of said structure to optimize said one or more Bossung parameters.
20. A method as defined in any of clauses 3 to 19, wherein said structure comprises a product structure having at least said first feature and said second feature.
21. A method as defined in clause 20, wherein said simulating step comprises:
    optimizing one or more aspects of said structure to optimize said one or more Bossung parameters, thereby determining an optimized structure; and
    determining whether the optimized structure will be yielding and/or will print robustly.
22. A method as defined in any of clauses 3 to 19, wherein said structure comprises a dedicated focus target.

23. A method as defined in any preceding clause, wherein said structure comprises a dose sensitive feature which is not focus sensitive.
24. A method as defined clause 23, wherein said simulating step comprises simulating the dose response of said dose sensitive feature.
25. A method as defined in any preceding clause, wherein said structure comprises one or more space features having an inverted Bossung response.
26. A method of measuring focus performance of a lithographic apparatus, the method comprising:
    (a) obtaining measurement data relating to metrology of a structure selected by the method according to any preceding clause, subsequent to said structure being formed on a substrate; and
    (b) deriving a measurement of focus performance based at least in part on the metrology data and a calibration model.
27. A method as defined in clause 26, wherein said measurement data comprises a value for the Bossung differential parameter for the structure formed on the substrate.
28. A method as defined in clause 26 or 27, wherein said structure is formed in a scribe lane of said substrate.
29. A method as defined in clause 26 or 27, wherein said structure is formed in a die area of said substrate.
30. A method as defined in clause 28 or 29, wherein said structure comprises actual product structure or a product-like structure.
31. A method as defined in any of clauses 26 to 30, comprising a step of creating the calibration model based on an exposure and subsequent measurement of the selected structure at different focus offsets.
32. A metrology apparatus for focus performance of a lithographic apparatus, the metrology apparatus being operable to perform the method of any of clauses 26 to 31.
33. A lithographic system comprising:
    a lithographic apparatus comprising:
    an illumination optical system arranged to illuminate a reflective patterning device;
    a projection optical system arranged to project an image of the patterning device onto a substrate; and
    a metrology apparatus according to clause 32;
    wherein the lithographic apparatus is arranged to use the measurement of focus performance derived by the metrology apparatus when applying the pattern to further substrates.
34. A lithographic cell comprising the metrology apparatus according to clause 32 and the lithographic system according to clause 33.
35. A computer program comprising processor readable instructions which, when run on suitable processor controlled apparatus, cause the processor controlled apparatus to perform the method of any of clauses 1 to 31.
36. A method of manufacturing devices wherein a device pattern is applied to a series of substrates using a lithographic process, the method including:
    using the method of any of clauses 26 to 31 to measure focus performance of the lithographic process, and controlling the lithographic process for later substrates in accordance with the measured focus performance.

The substrates on which these metrology patterns are formed may be production wafers or experimental wafers in product development. They may also be dedicated metrology wafers, for example monitor wafers which are processed intermittently as part of an advance process control (APC) mechanism.

In association with the physical grating structures defining the focus metrology patterns as realized on substrates and patterning devices, an embodiment may include a computer program containing one or more sequences of machine-readable instructions describing a method of designing focus metrology patterns, metrology recipes and/or controlling the inspection apparatus to implement the illumination modes and other aspects of those metrology recipes. This computer program may be executed for example in a separate computer system employed for the design/control process. As mentioned, calculations and control steps may be wholly or partly performed within unit PU in the apparatus of FIG. 3, and/or the control unit LACU of FIG. 2. There may also be provided a data storage medium (e.g., semiconductor memory, magnetic or optical disk) having such a computer program stored therein.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The breadth and scope of the present invention should not be limited by any of the above-described exemplary embodiments, but should be defined only in accordance with the following claims and their equivalents.

The invention claimed is:

1. A method comprising:
    simulating a Bossung response with focus of a focus dependent parameter, for a plurality of structures, wherein:
        the plurality of structures each comprise at least first and second features having respective first and second Bossung curve responses with focus for the focus dependent parameter, and
        the simulating comprises simulating, for each of the plurality of structures, a value for at least a Bossung differential parameter based on a relative focus shift between the first Bossung curve response with focus and the second Bossung curve response with focus; and
    selecting a structure for focus monitoring out of the plurality of structures in a manufacturing process based on the simulating.

2. The method of claim 1, wherein the simulating is performed using a computational lithography simulation.

3. The method of claim 1, wherein the relative focus shift is generated by determining a focus difference between corresponding points of the first Bossung curve response with focus and the second Bossung curve response with focus.

4. The method as claimed in claim 1, wherein:
    the structure selected is one for which the simulated value for the Bossung differential parameter exceeds a threshold value; and
    the Bossung differential parameter comprises a focus shift between Bossung responses of two of the structures.

5. The method of claim 4, wherein the threshold value is 5 nm or 10 nm.

6. The method of claim 1, wherein:
the simulating comprises simulating one or more printing qualities, and
the selecting comprises selecting the structure based on a co-optimization of the Bossung differential parameter and the one or more printing qualities.

7. The method of claim 1, further comprising applying a trained model to determine a preselected subset of the structures from which the selection will be made in the selecting.

8. The method of claim 1, wherein the structure comprises a product structure having at least the first feature and the second feature.

9. A method comprising:
simulating a value for at least a Bossung differential parameter based on a relative focus shift between a first and second Bossung curve response with focus, for each of a plurality of structures, to obtain measurement data relating to metrology of a structure;
selecting a structure for focus monitoring out of the plurality of structures in a manufacturing process based on the simulating, subsequent to the structure being formed on a substrate; and
deriving a measurement of focus performance based at least in part on the metrology data and a calibration model.

10. A metrology apparatus, comprising:
a measuring device configured to determine focus performance of a lithographic apparatus;
a stimulating device configured to simulate a value for at least a Bossung differential parameter based on a relative focus shift between a first and second Bossung curve response with focus, for each of a plurality of structures, and to select a structure for focus monitoring out of the plurality of structures in a manufacturing process based on the simulating, subsequent to the structure being formed on a substrate; and
a processing device configured to derive a measurement of focus performance based at least in part on the focus performance and a calibration model.

11. A computer program comprising processor readable instructions which, when run on a suitable processor controlled apparatus, cause the processor controlled apparatus to perform a method for selecting a structure for focus monitoring out of a plurality of structures, the method comprising:
simulating a Bossung response with focus of a focus dependent parameter, for a plurality of structures, wherein:
the plurality of structures each comprise at least first and second features having respective first and second Bossung curve responses with focus for the focus dependent parameter, and
the simulating comprises simulating, for each of the plurality of structures, a value for at least a Bossung differential parameter based on a relative focus shift between the first Bossung curve response with focus and the second Bossung curve response with focus; and
selecting a structure for focus monitoring out of the plurality of structures in a manufacturing process based on the simulating of the value for at least the Bossung differential parameter.

12. A method of manufacturing devices when a device pattern is applied to a series of substrates using a lithographic process, the method comprising:
simulating a value for at least a Bossung differential parameter based on a relative focus shift between a first and second Bossung curve response with focus, for each of a plurality of structures, to obtain measurement data relating to metrology of a structure;
selecting a structure for focus monitoring out of the plurality of structures in a manufacturing process based on the simulating, subsequent to the structure being formed on a substrate;
deriving a measurement of focus performance based at least in part on the metrology data and a calibration model; and
controlling the lithographic process for later substrates in accordance with the measured focus performance.

* * * * *